United States Patent
Wang

(10) Patent No.: US 7,216,424 B2
(45) Date of Patent: May 15, 2007

(54) METHOD FOR FABRICATING ELECTRICAL CONNECTIONS OF CIRCUIT BOARD

(75) Inventor: Ying-Tung Wang, Hsin-chu (TW)

(73) Assignee: Phoenix Precision Technology Corporation, Hsin-chu (TW)

( * ) Notice: Subject to any disclaimer, the term of this patent is extended or adjusted under 35 U.S.C. 154(b) by 338 days.

(21) Appl. No.: 11/023,363

(22) Filed: Dec. 29, 2004

(65) Prior Publication Data
US 2006/0043158 A1 Mar. 2, 2006

(30) Foreign Application Priority Data
Sep. 1, 2004 (TW) .............................. 93126322 A

(51) Int. Cl.
H05K 3/02 (2006.01)
H05K 3/06 (2006.01)
H05K 3/40 (2006.01)

(52) U.S. Cl. ..................... 29/843; 29/846; 29/847; 29/850; 29/852; 29/874; 228/180.22

(58) Field of Classification Search ............. 29/846, 29/847, 850, 874, 848, 852, 853, 840, 842, 29/843; 174/250, 251, 255, 256, 257, 260, 174/261–267; 205/125; 216/17, 18, 94; 228/248.1, 246; 361/748; 438/612, 613, 438/614, 615
See application file for complete search history.

(56) References Cited

U.S. PATENT DOCUMENTS

| 6,576,541 B2 * | 6/2003 | Hu ............................. 438/614 |
| 7,081,402 B2 * | 7/2006 | Hsu et al. .................. 438/612 |
| 2001/0040290 A1 * | 11/2001 | Sakurai et al. ............. 257/737 |
| 2006/0090335 A1 * | 5/2006 | Hsu et al. ..................... 29/874 |

* cited by examiner

Primary Examiner—Peter Vo
Assistant Examiner—Livius R. Cazan
(74) Attorney, Agent, or Firm—Clark & Brody; William F. Nixon

(57) ABSTRACT

A method for fabricating electrical connections of a circuit board is provided. The circuit board has a plurality of electrical connection pads thereon. A protective layer is applied on the circuit board and has a plurality of openings for exposing the electrical connection pads. A conductive layer is formed on the protective layer and the electrical connection pads. A resist layer is applied on the conductive layer and has a set of openings for exposing a portion of the conductive layer covering some of the electrical connection pads. A first metal layer is electroplated in the openings of the resist layer. Another set of openings are formed through the resist layer corresponding to the rest of the electrical connection pads. A second metal layer is electroplated on the first metal layer and above the rest of the electrical connection pads to form different electrical connections on the circuit board.

18 Claims, 7 Drawing Sheets

METHOD FOR FABRICATING ELECTRICAL CONNECTIONS OF CIRCUIT BOARD

FIELD OF THE INVENTION

The present invention relates to methods for fabricating electrical connections of circuit boards, and more particularly, to a method for fabricating various types of electrical connections on a circuit board.

BACKGROUND OF THE INVENTION

In the current flip-chip technology, electrode pads are formed on a surface of a surface mount device (SMD) such as a semiconductor integrated circuit (IC) chip, and corresponding electrical connection pads are provided on an organic package substrate. Solder bumps or other electrically conductive adhesive materials are formed between the chip and the package substrate so as to allow an active surface of the chip to be mounted on the package substrate in a face-down manner, such that the solder bumps or electrically conductive adhesive materials serve as input/output (IO) connections for electrically and mechanically connecting the chip to the package substrate.

Besides the chip, other surface mount devices such as a passive component can also be mounted on and electrically connected to the same package substrate so as to improve electrical performances. However, for accommodating the different surface mount devices, electrical connection pads on the package substrate need to be coated with solder of different heights and sizes, such that the electrical connections with different heights are formed to be correspondingly electrically connected to various types of the surface mount devices.

Further, when a packaging process for the package substrate, the chip and the passive component is subsequently performed, a plurality of solder balls are usually implanted on a surface of the substrate to electrically connect the substrate to an external electronic device. A solder material is pre-formed on electrical connection pads of the substrate where the solder balls are to be implanted so as to effectively mount the solder balls on the substrate.

A stencil printing technique is commonly employed to form such solder material on the substrate. Referring to FIG. 1 to conduct the stencil printing technique, primarily a package substrate 10 is provided, wherein on a surface of the package substrate 10 there are formed a solder mask layer 11 and a plurality of electrical connection pads 12 for defining locations of the solder material such as solder paste (not shown). A stencil 13 having a plurality of grids 13a is mounted on the package substrate 10. After the solder material is placed on the stencil 13, a roller 14 is used to repeatedly roll on the stencil 13; or a spraying process is performed to spray the solder material over the stencil 13. As a result, the solder material can be deposited in the grids 13a to form solder (not shown) on the electrical connection pads 12 after the stencil 13 is removed. Subsequently, under a reflow-temperature condition in which the solder would melt, the solder is subjected to a reflow-soldering process to form soldering elements (not shown) on the electrical connection pads 12 of the package substrate 10, and the soldering elements can be electrically connected to an external electronic device.

However, in order to coat solder of different heights and sizes on the electrical connection pads of the package substrate to form the electrical connections with different heights for being electrically connected to various types of the surface mount devices, the foregoing stencil printing process should be performed 2 to 3 or even more times, and also the reflow-soldering process needs to be carried out 2 to 3 or even more times. This makes the fabrication processes rather complicated and time-consuming, thereby significantly increasing the fabrication cost.

Moreover, since each of the electrical connection pads is partially covered by the solder mask layer located between the pads, the exposed part of each of the electrical connection pads is reduced in size. This not only causes a problem of subsequently aligning the solder bumps to the electrical connection pads but also makes the solder difficult to be attached to the electrical connection pads, such that the yield of the stencil printing technique would be degraded and an overflow of the melted solder material may occur during the reflow-soldering process.

Furthermore, to precisely apply the solder material using the stencil printing technique, besides the accurate size of the stencil, the times and cleanness of the stencil printing process being performed should also be concerned. Due to viscosity of the solder material, the more times of the stencil printing process being performed, the more residues of the solder material on walls of the grids of the stencil are. This would cause the amount and shape of the solder material in the next time of stencil printing to be different from those required for the electrical connection pads. Therefore, practically after the stencil printing process has been performed a certain number of times, the stencil must be wiped and cleaned, otherwise it would lead to the problem of the inaccurate shape and size of the solder material, and cause an inconvenience in fabrication, as well as degrade the quality and reliability of products.

Accordingly, the problem to be solved here is to provide a method for fabricating electrical connections with different heights on a circuit board by easily and effectively coating solder of different heights on electrical connection pads of the circuit board, so as to allow the electrical connections with different heights on the circuit board to be electrically connected to different types of electronic elements.

SUMMARY OF THE INVENTION

In light of the above prior-art drawbacks, a primary objective of the present invention is to provide a method for fabricating electrical connections of a circuit board, by which electrical connection pads of the circuit board are coated with solder of different heights and sizes such that the electrical connections with different heights and sizes are formed to be electrically connected to different electronic elements.

In accordance with the above and other objectives, the present invention proposes a method for fabricating electrical connections of a circuit board, including the steps of: providing a circuit board having a plurality of electrical connection pads formed on a surface thereof, wherein a protective layer is applied on the surface of the circuit board and has a plurality of openings for exposing the electrical connection pads; forming a conductive layer on the protective layer and the electrical connection pads; applying a resist layer on the conductive layer, and forming a plurality of openings through the resist layer to expose a portion of the conductive layer corresponding in position to some of the electrical connection pads; electroplating a first metal layer in the openings of the resist layer; forming another plurality of openings through the resist layer to expose another portion of the conductive layer corresponding in position to the rest of the electrical connection pads not having the first metal layer thereabove; and finally, electroplating a second metal layer on the first metal layer deposited above some of the electrical connection pads and on the exposed portion of the conductive layer corresponding in position to the rest of the electrical connection pads. The electrical connection pads can be formed on a single surface of the circuit board, or on both upper and lower surfaces of the circuit board. Further, the sizes and uses of the electrical connection pads can differ from each other.

Therefore, by the method for fabricating electrical connections of a circuit board according to the present invention, a resist layer is formed on a surface of the circuit board having electrical connection pads thereon. A plurality of openings are firstly formed through the resist layer at positions corresponding to some of the electrical connection pads that require a relatively larger height, such that a first metal layer can be electroplated on those electrical connection pads exposed via the openings. Then, another plurality of openings are formed through the resist layer at positions corresponding to the rest of the electrical connection pads, and a second metal layer (such as a solder material) is simultaneously electroplated on all of the electrical connection pads. As a result, the electrical connection pads of different sizes on the circuit board can be easily coated with solder materials of different heights such that electrical connections of different heights are formed to be electrically connected to different types of electronic elements. Moreover, the present invention needs not to perform multiple times of printing and reflow-soldering processes, and thus ensures the quality and reliability of the electrical connections, and effectively simplifies the fabrication processes, as well as reduces the fabrication cost.

BRIEF DESCRIPTION OF THE DRAWINGS

The present invention can be more fully understood by reading the following detailed description of the preferred embodiments, with reference made to the accompanying drawings, wherein.

DETAILED DESCRIPTION OF THE PREFERRED EMBODIMENTS

Preferred embodiments of electrical connections of a circuit board and a method for fabricating the same proposed in the present invention are described in detail as follows with reference to FIGS. 2A to 2I and FIGS. 3A to 3I. It is to be noted that the drawings are simplified schematic diagrams and only illustrate basic architecture of the present invention. In other words, the drawings only show the components or elements relevant to the present invention, and these components or elements are not drawn in real numbers, shapes and sizes. The actual numbers, shapes and sizes of components or elements can be flexibly made according to a practical design, and the arrangement of components or elements should be more complex in reality. Particularly, it should be understood that, in the method for fabricating electrical connections of a circuit board according to the present invention, the electrical connections comprise electrical connection pads and other structures formed on the pads as described hereinafter.

First Preferred Embodiment

FIGS. 2A to 2I are cross-sectional views showing a method for fabricating electrical connections of a circuit board according to a first preferred embodiment of the present invention.

Figure 1:
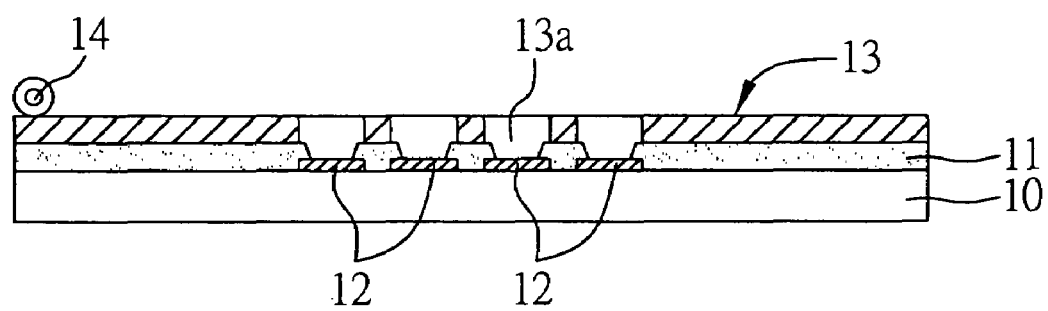
FIG. 1 (PRIOR ART) is a cross-sectional view showing conventional deposition of a solder material on electrical connection pads of a substrate using stencil printing technology.
Figure 2A:
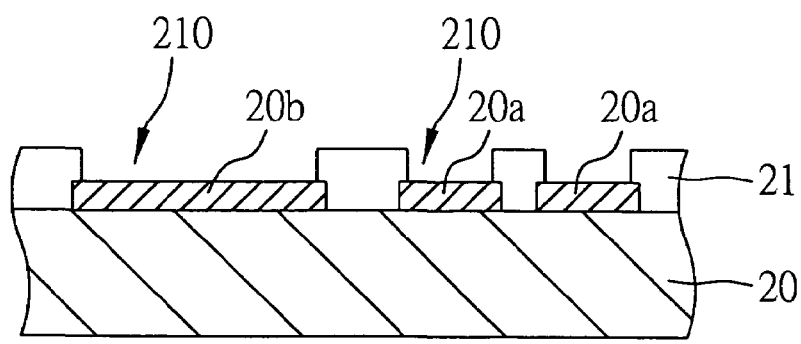
FIGS. 2A to 2I are cross-sectional views showing a method for fabricating electrical connections of a circuit board according to a first preferred embodiment of the present invention.

Referring first to FIG. 2A, a circuit board 20 is provided with a plurality of first electrical connection pads 20a and second electrical connection pads 20b being formed on a surface thereof, wherein in this embodiment, the first electrical connection pad 20a is smaller in area than the second electrical connection pad 20b. It should be understood that the present invention does not limit to the above arrangement; that is, the numbers and areas of the first and second electrical connection pads 20a, 20b are not limited to those in this embodiment but can be flexibly arranged according to practical requirements, and the location of the first and second electrical connection pads 20a, 20b is not limited to one surface of the circuit board 20. Further, a plurality of conductive traces (not shown) can be formed on the surface of the circuit board 20 and are electrically connected to the first and second electrical connection pads 20a, 20b. There are many techniques for forming the electrical connection pads and conductive traces of the circuit board known in the art, which are not technical features of the present invention and thus not to be further described herein. The surface of the circuit board 20 having the first and second electrical connection pads 20a, 20b may be a chip side for mounting a chip. For example, the first electrical connection pads 20a are used to electrically connect a semiconductor chip such as a flip chip thereto, and the second electrical connection pads 20b are used to electrically connect passive components thereto. Moreover, a protective layer 21 is applied on the surface of the circuit board 20 having the first and second electrical connection pads 20a, 20b by a printing or roller coating technique. The protective layer 21 can be made of a solder mask material, and is formed with a plurality of openings 210 for exposing the first and second electrical connection pads 20a, 20b.

Figure 2B:
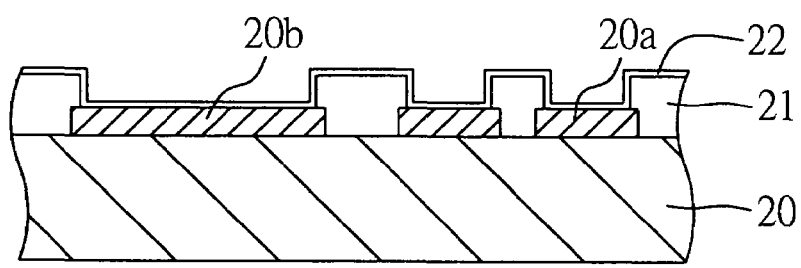

Referring to FIG. 2B, a conductive layer 22 is formed on a surface of the protective layer 21 and surfaces of the first and second electrical connection pads 20a, 20b. The conductive layer 22 primarily serves as a current conductive path for subsequently electroplating metal materials. The conductive layer 22 can be made of a metal material such as copper, tin, nickel, chromium, titanium, copper-chromium alloy, or tin-lead alloy, or alternatively made of a conductive polymer material.

Figure 2C:
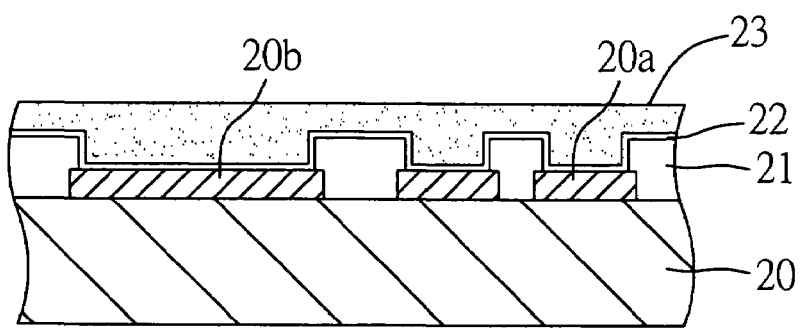

Referring to FIG. 2C, a resist layer 23, such as a photoresist layer made of a dry film or liquid photoresist, is applied on the conductive layer 22 by the printing, roller coating or pressing technique.

Figure 2D:
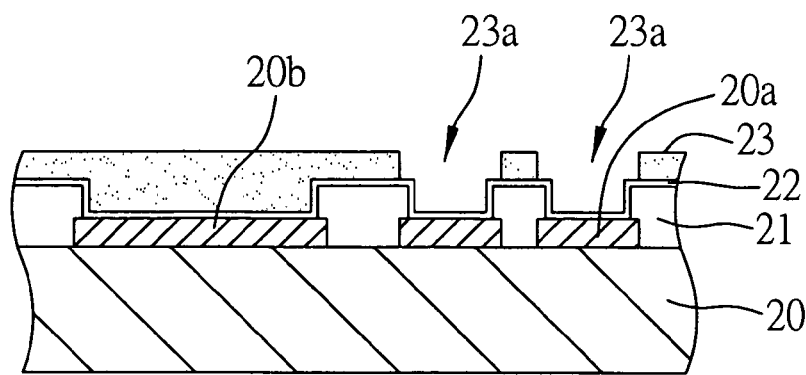

Referring to FIG. 2D, the resist layer 23 is patterned using exposing and developing techniques to form a plurality of first openings 23a therethrough for exposing a portion of the conductive layer 22 corresponding in position to the first electrical connection pads 20a, and the rest of the resist layer 23 remains intact. If the resist layer 23 is made of a non-photosensitive insulating material, the first openings 23a can be formed by a laser drilling or plasma etching technique.

Figure 2E:
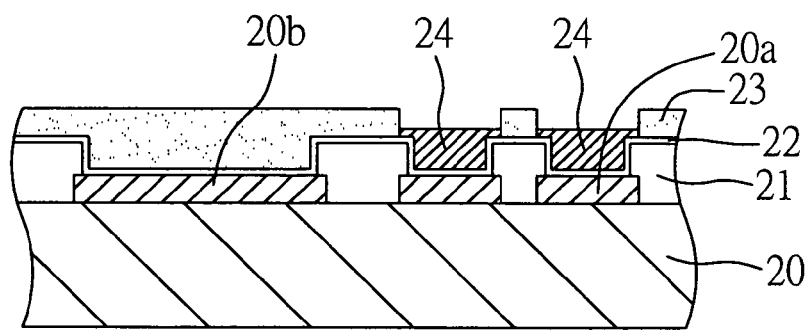

Referring to FIG. 2E, a first metal layer 24 is deposited in the first openings 23a by an electroplating process. The first metal layer 24 can be made of the same metal material as that for the conductive layer 22, or alternatively made of other conductive metal materials (such as copper, nickel, gold, or solder materials, etc.). The height of the first metal layer 24 can be adjusted depending on practical requirements.

Figure 2F:
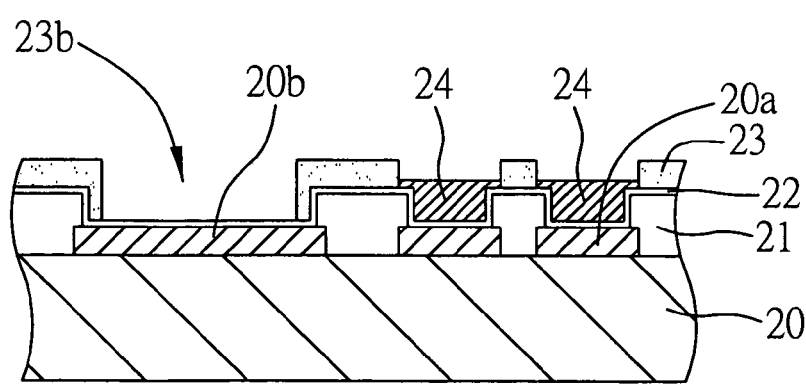

Referring to FIG. 2F, a plurality of second openings 23b are formed through the resist layer 23 by for example, the laser drilling or plasma etching technique, such that another portion of the conductive layer 22 corresponding in position to the second electrical connection pads 20b is exposed via the second openings 23b.

Figure 2G:
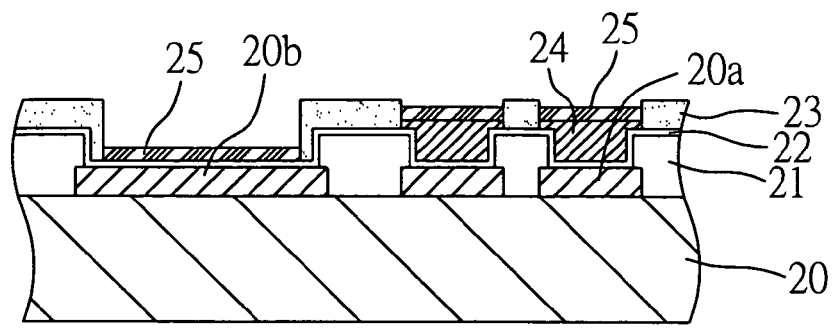

Referring to FIG. 2G, another electroplating process is performed on the circuit board 20. The conductive layer 22 and the first metal layer 24 having conductivity serve as a current conductive path during the electroplating process to deposit a second metal layer 25 such as a solder material on the first metal layer 24 and the exposed portion of the conductive layer 22 corresponding in position to the second electrical connection pads 20b. The solder material for the second metal layer 25 can be an alloy made of a mixture of metals such as lead, tin, silver, copper, bismuth, antimony, zinc, nickel, zirconium, magnesium, indium, tellurium and gallium. With provision of the first metal layer 24, a portion of the second metal layer 25 located above the first electrical connection pads 20a is higher in elevation than a portion of the second metal layer 25 located above the second electrical connection pads 20b. This allows different types of electronic elements (not shown) to be subsequently electrically connected to the first and second electrical connection pads 20a, 20b.

Figure 2H:
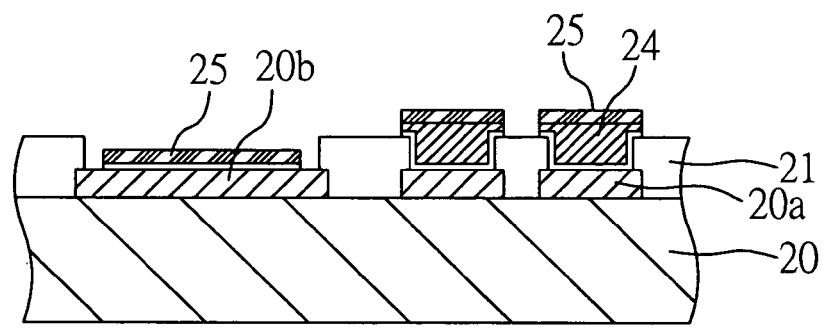

Referring to FIG. 2H, the rest of the resist layer 23 is removed, and a portion of the conductive layer 22 being previously covered by the resist layer 23 can be removed using an etching technique.

Figure 2I:
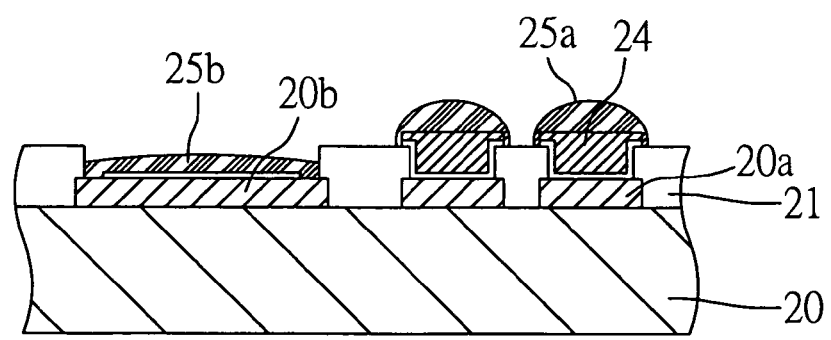

Referring finally to FIG. 2I, in the case that the second metal layer 25 is made of the solder material, a reflow-soldering process is performed under a reflow-temperature condition in which the electroplated solder material would melt, such that the solder material is reflow-soldered to form first soldering elements 25a and second soldering elements 25b on the first metal layer 24 of the first electrical connection pads 20a and above the second electrical connection pads 20b respectively.

As the first soldering elements 25a and the second soldering elements 25b respectively located on the first metal layer 24 of the first electrical connection pads 20a and above the second electrical connection pads 20b have different heights and sizes, different types of electrical connections are formed to be electrically connected to various electronic elements. Further in the present invention, the first metal layer such as a copper layer is firstly formed on some of the electrical connection pads, and then the second metal layer such as a solder material is electroplated on the first metal layer. As such, the first metal layer is deposited using a relatively lower cost copper material in a higher electroplating speed, and the second metal layer is deposited using a relatively higher cost solder material in a lower electroplating speed, such that the fabrication cost and time are both reduced, unlike the stencil printing process used in the prior art that an increase in fabrication cost and technological difficulty are caused by altering the size of grids of a stencil in response to reduction of sizes of electrical connection pads and pitches therebetween, and that an inconvenience in fabrication is caused due to multiple performances of the stencil printing processes and the cleanness problem of the stencil.

Second Preferred Embodiment

FIGS. 3A to 3I are cross-sectional views showing the method for fabricating electrical connections of a circuit board according to a second preferred embodiment of the present invention.

Figure 3A:
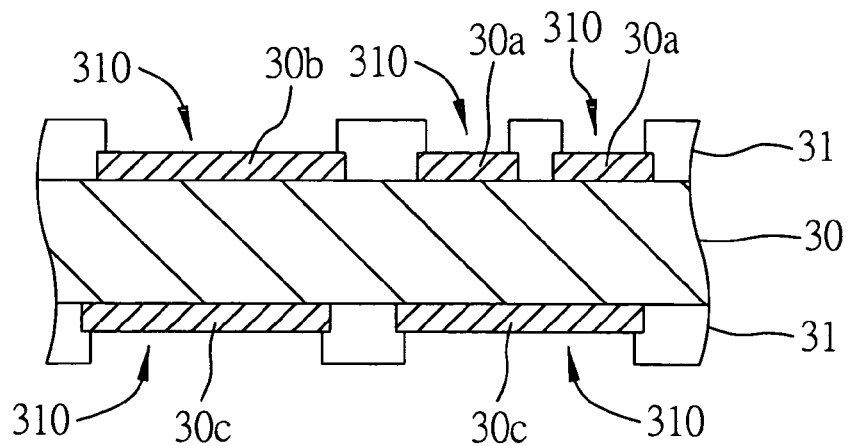
FIGS. 3A to 3I are cross-sectional views showing the method for fabricating electrical connections of a circuit board according to a second preferred embodiment of the present invention.

Referring first to FIG. 3A, a circuit board 30 is provided, wherein a plurality of first electrical connection pads 30a and second electrical connection pads 30b are formed on an upper surface thereof, and a plurality of third electrical connection pads 30c are provided on an opposite lower surface of the circuit board 30. The first, second and third electrical connection pads 30a, 30b, 30c can be electrically interconnected by the means of conductive structures such as conductive through holes or vias (not shown) formed in the circuit board 30. It should be understood that, the present invention is not limited to the numbers and sizes of the first, second and third electrical connection pads 30a, 30b, 30c shown in this embodiment, but the numbers, sizes and location of the first, second and third electrical connection pads 30a, 30b, 30c can be flexibly arranged depending on practical requirements. Further, a plurality of conductive traces (not shown) can also be formed on the surfaces of the circuit board 30. There are many techniques for forming the electrical connection pads and conductive traces of the circuit board known in the art, which are not technical features of the present invention and thus not to be further described herein. In this embodiment, the upper surface of the circuit board 30 having the first and second electrical connection pads 30a, 30b can be a chip side for mounting a chip, and the lower surface of the circuit board 30 having the third electrical connection pads 30c can be a ball side for implanting solder balls. However, the present invention is not limited to such arrangement.

Moreover, a protective layer 31 is respectively applied on the upper and lower surfaces of the circuit board 30 by a printing or roller coating technique. The protective layers 31 can be made of a solder mask material, and are formed with a plurality of openings 310 for exposing the first, second and third electrical connection pads 30a, 30b, 30c.

Figure 3B:
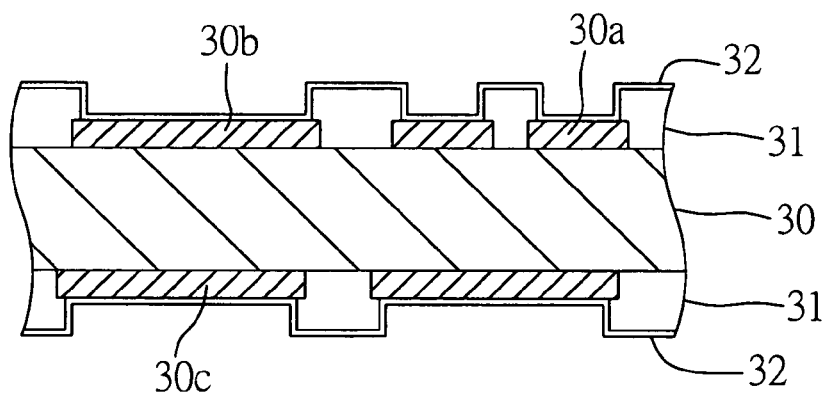

Referring to FIG. 3B, a conductive layer 32 is respectively formed on surfaces of the protective layers 31 and the first, second and third electrical connection pads 30a, 30b, 30c. The conductive layers 32 primarily serve as a current conductive path for subsequently electroplating metal materials. The conductive layers 32 can be made of a metal material such as copper, tin, nickel, chromium, titanium, copper-chromium alloy, or tin-lead alloy, or alternatively can be made of a conductive polymer material.

Figure 3C:
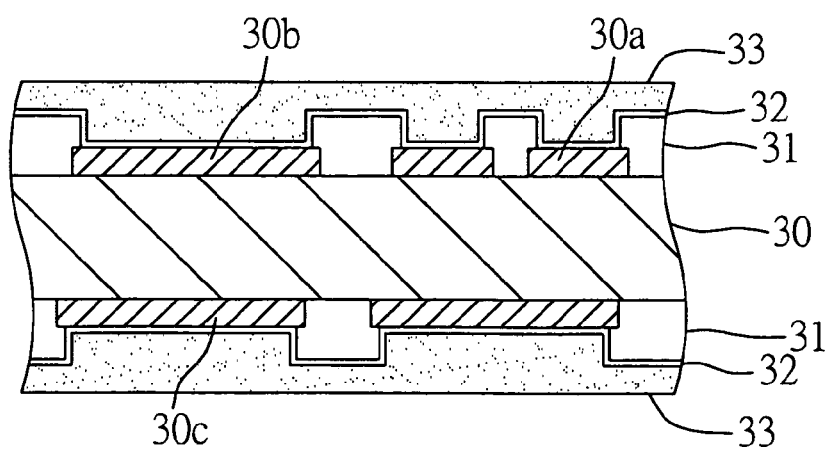

Referring to FIG. 3C, a resist layer 33, such as a photoresist layer made of a dry film or liquid photoresist, is respectively applied on the conductive layers 32 by the printing or roller coating technique.

Figure 3D:
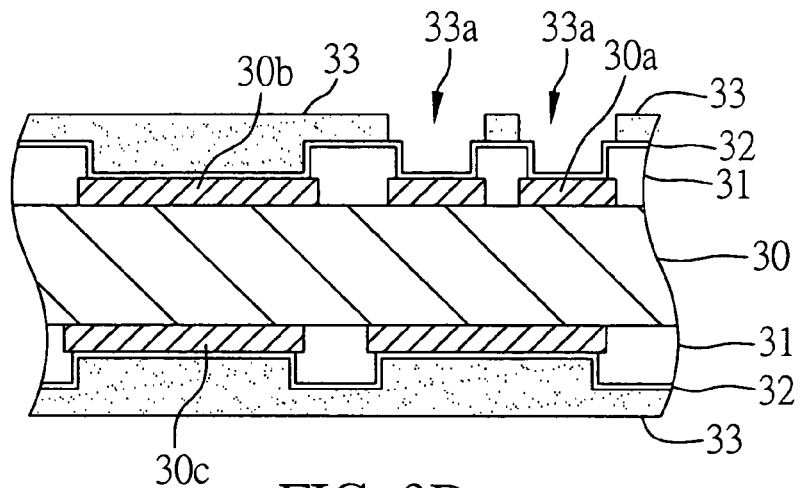

Referring to FIG. 3D, one of the resist layers 33 is patterned using exposing and developing techniques to form a plurality of first openings 33a therethrough for exposing a portion of the corresponding conductive layer 32 covering the first electrical connection pads 30a, and the rest of the resist layers 33 remains intact. If the resist layer 33 is made of a non-photosensitive insulating material, the first openings 33 a can be formed by a laser drilling or plasma etching technique.

Figure 3E:
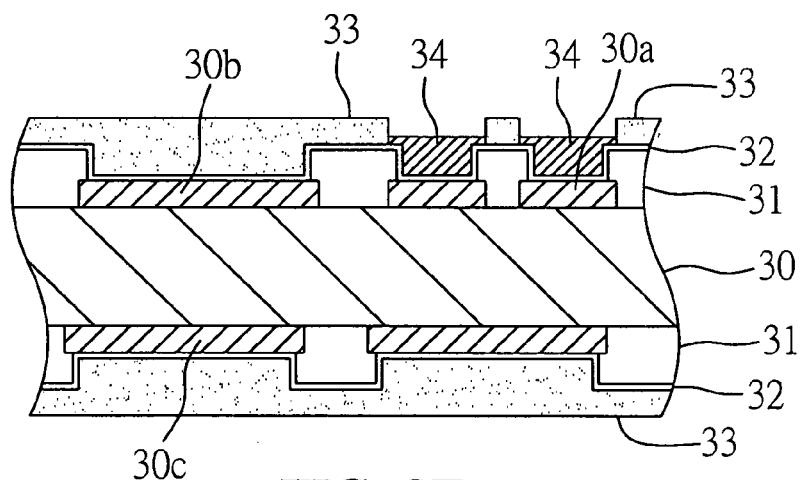

Referring to FIG. 3E, a first metal layer 34 is deposited in the first openings 33a by an electroplating process. The first metal layer 34 can be made of the same metal material as that for the conductive layers 32, or alternatively can be other conductive metal materials. The height of the first metal layer 34 can be adjusted depending on practical requirements.

Figure 3F:
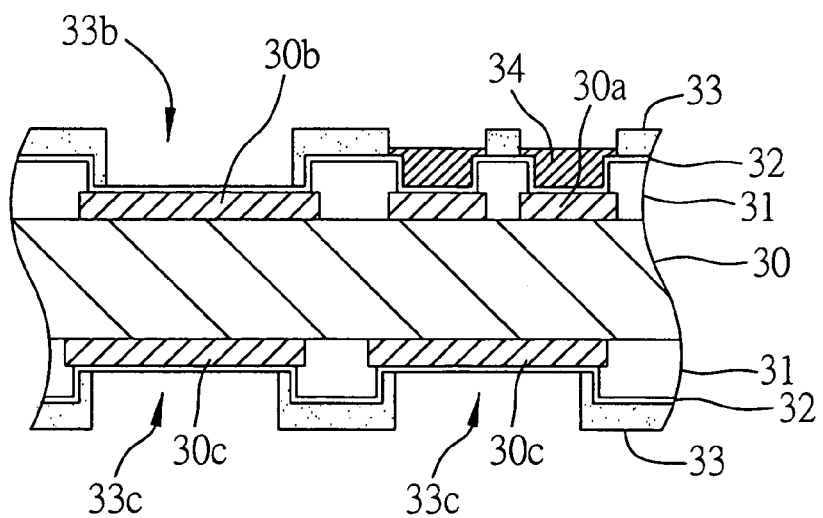

Referring to FIG. 3F, a plurality of second openings 33b and third openings 33c are respectively formed through the resist layers 33 by for example, the laser drilling or plasma etching technique, such that portions of the conductive layers 32 corresponding in position to the second electrical connection pads 30b and third electrical connection pads 30c respectively are exposed via the second openings 33b and third openings 33c.

Figure 3G:
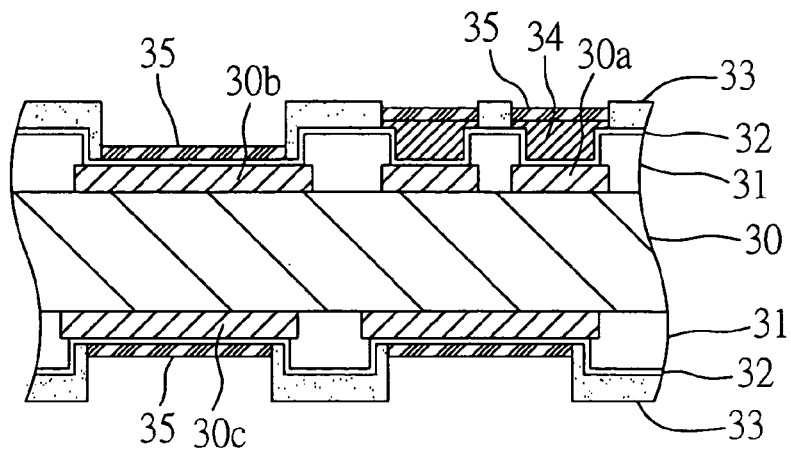

Referring to FIG. 3G, an electroplating process is performed on the circuit board 30. The conductive layers 32 having conductivity serve as a current conductive path during the electroplating process to deposit a second metal layer 35 such as a solder material respectively on the portions of the conductive layers 32 located above the second electrical connection pads 30b and third electrical connection pads 30c and on the first metal layer 34 located above the first electrical connection pads 30a. The solder material for the second metal layer 35 can be made of an alloy of a mixture of metals such as lead, tin, silver, copper, bismuth, antimony, zinc, nickel, zirconium, magnesium, indium, tellurium and gallium. With provision of the first metal layer 34, the second metal layer 35 located above the first electrical connection pads 30a is higher in elevation than the second metal layers 35 located above the second electrical connection pads 30b and the third electrical connection pads 30c. The second metal layers 35 can be simultaneously formed on different pads such as the first, second and third electrical connection pads 30a, 30b, 30c. And these different electrical connection pads may be electrically connected to various types of electronic elements (not shown).

Figure 3H:
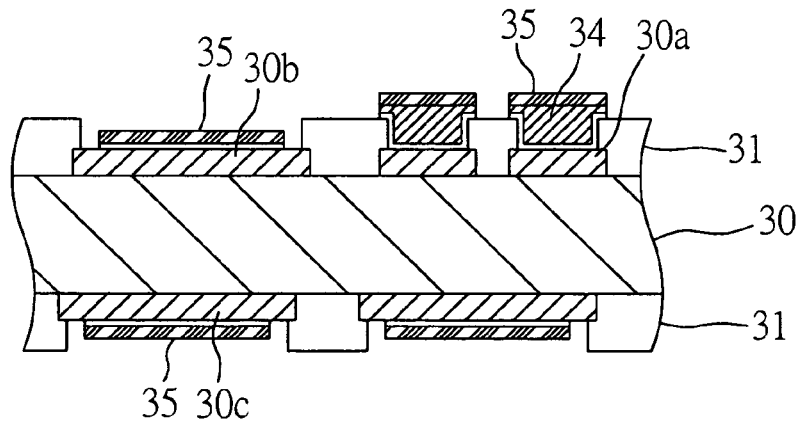

Referring to FIG. 3H, the rest of the resist layers 33 is removed, and the conductive layers 32 being previously covered by the resist layer 33 can be removed using an etching technique.

Figure 3I:
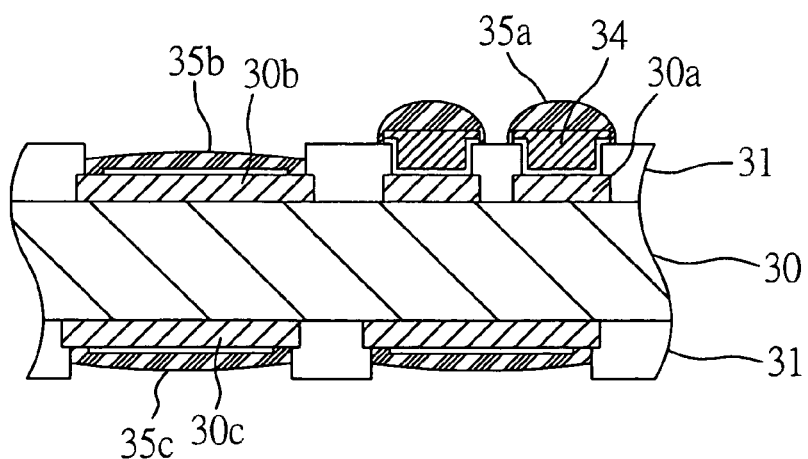

Referring to FIG. 3I, in the case that the second metal layers 35 are made of the solder material, a reflow-soldering process is performed under a reflow-temperature condition in which the electroplated solder material would melt, such that the solder material is reflow-soldered to form a plurality of first soldering elements 35a, second soldering elements 35b and third soldering elements 35c on the first metal layer 34 of the first electrical connection pads 30a and above the second electrical connection pads 30b and the third electrical connection pads 30c, respectively.

As the first soldering elements 35a, the second soldering elements 35b and the third soldering elements 35c respectively located on the first metal layer 34 of the first electrical connection pads 30a and above the second electrical connection pads 30b and the third electrical connection pads 30c have different heights and sizes, different types of electrical connections are formed to be electrically connected to various electronic elements. For example, the first soldering elements 35a can serve as solder bumps for electrically connecting a semiconductor chip, and the second soldering elements 35b can be used to mount electronic elements such as passive components using surface mount technology; further, the third soldering elements 35c can be used to mount solder balls for electrically connecting the circuit board 30 to external electronic elements.

It should be noted that, the drawings in the present invention only show some of the electrical connection pads. Practically, the types, numbers, uses and locations of electrical connection pads are not limited to those described in the above embodiments but can be adjusted and flexibly arranged on the circuit board depending on the practical requirement. Also, the fabrication method in the present invention is applicable to one single side or double sides of the circuit board or a package substrate.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A method for fabricating electrical connections of a circuit board, comprising the steps of:
providing a circuit board having a plurality of first and second electrical connection pads formed on a surface thereof, and applying a protective layer on the surface of the circuit board, the protective layer having a plurality of openings for exposing the first and second electrical connection pads;
forming a conductive layer on the protective layer and the exposed electrical connection pads;
applying a resist layer on the conductive layer, and forming a plurality of openings through the resist layer to expose a portion of the conductive layer corresponding in position to the first electrical connection pads;
depositing a first metal layer in the openings of the resist layer;
forming another plurality of openings through the resist layer to expose another portion of the conductive layer corresponding in position to the second electrical connection pads free of having the first metal layer thereabove; and
depositing a second metal layer on the first metal layer deposited above the first electrical connection pads and on the exposed portion of the conductive layer corresponding in position to the second electrical connection pads.

2. The method of claim 1, further comprising a step of:
removing the resist layer and a portion of the conductive layer covered by the resist layer.

3. The method of claim 1, wherein the electrical connection pads are formed on a single surface of the circuit board.

4. The method of claim 1, wherein the electrical connection pads are formed on upper and lower surfaces of the circuit board.

5. The method of claim 1, wherein the first metal layer is made of a material selected from the group consisting of copper, nickel, gold, and solder material.

6. The method of claim 1, wherein the second metal layer is made of a solder material.

7. The method of claim 6, wherein the solder material is subjected to a reflow-soldering process to form soldering elements on the electrical connection pads.

8. The method of claim 7, wherein the soldering elements serve to mount a semiconductor chip thereon.

9. The method of claim 7, wherein the soldering elements serve to mount a passive component thereon.

10. The method of claim 7, wherein the soldering elements serve to mount solder balls thereon.

11. The method of claim 1, wherein the protective layer is applied by a technique selected from the group consisting of printing, and roller coating techniques.

12. The method of claim 1, wherein the protective layer is made of a solder mask material.

13. The method of claim 1, wherein the conductive layer is made of a metal material.

14. The method of claim 1, wherein the conductive layer is made of a conductive polymer material.

15. The method of claim 1, wherein the resist layer is made of a dry film.

16. The method of claim 1, wherein the openings through the resist layer are formed by exposing and developing techniques.

17. The method of claim 1, wherein the openings through the resist layer are formed by a laser drilling or plasma etching technique.

18. The method of claim 1, wherein the first metal layer and the second metal layer are deposited by an electroplating process.

* * * * *